United States Patent [19]

Nagayama

[11] Patent Number: 4,714,882
[45] Date of Patent: Dec. 22, 1987

[54] TWO-DIMENSIONAL NUCLEAR MAGNETIC RESONANCE SPECTROSCOPY METHOD

[75] Inventor: Kuniaki Nagayama, Tokyo, Japan
[73] Assignee: JEOL, Ltd., Tokyo, Japan
[21] Appl. No.: 799,128
[22] Filed: Nov. 18, 1985
[30] Foreign Application Priority Data Dec. 14, 1984 [JP] Japan .................................. 59-263988

[51] Int. Cl.$^4$ .......................................... G01R 33/20
[52] U.S. Cl. .................................... 324/307; 324/309; 324/312
[58] Field of Search ............... 324/309, 307, 311, 312, 324/313, 314

[56] References Cited

U.S. PATENT DOCUMENTS

| 4,134,058 | 1/1979 | Ernst ................................... 324/307 |
| 4,510,449 | 4/1985 | Ernst et al. ......................... 324/309 |
| 4,513,247 | 4/1985 | Ernst ................................... 324/309 |
| 4,626,783 | 12/1986 | Ohuchi ................................ 324/307 |

OTHER PUBLICATIONS

"COCONOSY. Combination of 2D Correlated and 2D Nuclear Overhauser Enhancement Spectroscopy in a Single Experiment", Haasnoot et al., pp. 343-349, *Journal of Magnetic Resonance*, 56 (1984).
"Combined COSY-NOESY Experiment" by Gurevich et al., pp. 471-478, *Journal of Magnetic Resonance*, 56 (1984).

*Primary Examiner*—Michael J. Tokar
*Assistant Examiner*—Scott M. Oldham
*Attorney, Agent, or Firm*—Webb, Burden, Robinson & Webb

[57] ABSTRACT

In accordance with the invention, two detection periods $t_2$ and $t_2'$ are set by the use of a pulse train essentially consisting of three pulses. Free induction decay signals FIDa and FIDb obtained during the two periods, respectively, are stored in respective data files. The measurement is repeated a plurality of times while putting at least one of the three pulses of the pulse train out of phase with the others. The free induction decay signals FIDa and FIDb derived by each measurement are stored in their respective data files. After the measurements, a linear combination of the data items which are stored in the data files assigned either to the signals FIDa or to FIDb is formed. The resultant data is subjected to double Fourier transformation to obtain a two-dimensional NMR spectrum. The manner in which the data items are linearly combined is appropriately selected to obtain a desired kind of two-dimensional NMR spectrum.

4 Claims, 18 Drawing Figures

TWO-DIMENSIONAL NUCLEAR MAGNETIC RESONANCE SPECTROSCOPY METHOD

FIELD OF THE INVENTION

The present invention relates to a two-dimensional nuclear magnetic resonance spectroscopy and, more particularly, to a two-dimensional NMR spectroscopy that can produce different kinds of information simultaneously by a single measurement.

BACKGROUND OF THE INVENTION

In recent years, two-dimensional NMR spectroscopies have attracted interest as new NMR spectroscopies. They are two-dimensional correlation spectroscopy (COSY) in which a measurement is made in the sequence shown in FIG. 1(a), spin-echo correlation spectroscopy (SECSY) in which a measurement is made in the sequence shown in FIG. 1(b), two-dimensional correlation spectroscopy (NOESY) which makes use of the nuclear Overhauser effect (NOE) and in which a measurement is made in the sequence shown in FIG. 1(c), etc. In this way, various two-dimensional NMR spectroscopies are utilized, depending on the kind of information to be derived. These are able to extract useful information with high resolution.

Referring to FIGS. 1(a), (b), and (c), a free induction decay signal is detected for a period of time $t_2$ and stored in a memory. This single measurement is repeated with successively different values of evolution period $t_1$. Free induction decay signals are obtained by these measurements and stored in the memory, corresponding to the values of $t_1$. The resultant set $S(t_1, t_2)$ of the stored data is subjected to double Fourier transformation with respect to $t_2$ and $t_1$. In this way, a two-dimensional spectrum is provided. In FIG. 1(c), $\tau$ denotes a mixing period.

This two-dimensional NMR spectroscopy requires that measurement be repeated with several hundred to several thousand different values of $t_1$. Further, an integration operation is performed for improving the signal-to-noise ratio in the conventional manner. Hence, it is inevitable that the measurements take as much as several to tens of hours. Therefore, if a plurality of two-dimensional spectra, e.g., a COSY spectrum, an SECSY spectrum, and an NOESY spectrum, are obtained from a single sample, the required time will triple. If the sample is stable, no problem will take place however long it takes. However, if the sample is unstable because it is a living body, for example, the sample will decompose before the three measurements are completed. This introduces the possibility that the obtained three spectra do not give the same information.

In view of the foregoing, C. A. G. Haasnoot et al. (*Journal of Magnetic Resonance*, 56 pp. 343-349, 1984) and A. Z. Gurevich et al. (*Journal of Magnetic Resonance*, 56, pp. 471-478, 1984) attempted to halve the measurement time compared with the case in which a COSY spectrum and an NOESY spectrum are separately obtained, by deriving the two spectra simultaneously by one measurement. More specifically, they have noted that the mixing period $\tau$ in the sequence for obtaining an NOESY spectrum as shown in FIG. 1(c) corresponds to the period during which a detection is made in the sequence for obtaining a COSY spectrum as shown in FIG. 1(a). This period is referred to as the second detection period $t_2'$, and during which a free induction decay signal is detected to give rise to a COSY spectrum. The sequence in which measurements are made is illustrated in FIG. 2. Free induction decay signals FIDa and FIDb which are obtained during the detection periods $t_2'$ and $t_2$, respectively, are stored in their respective data files. COSY and NOESY spectra are produced from the free induction decay signals FIDa and FIDb, respectively.

Unfortunately, two-dimensional spectra obtained in accordance with these procedures are limited to COSY and NOESY spectra. When other kinds of two-dimensional spectra are to be obtained, additional measurements must be made.

SUMMARY OF THE INVENTION

It is the main object of the present invention to provide a two-dimensional NMR spectroscopy which can obtain a larger amount of data than conventional, essentially all two-dimensional NMR data, by one measurement.

It is another object of the invention to provide a two-dimensional NMR spectroscopy which can offer a number of two-dimensional spectra in a quite short time.

The two-dimensional NMR spectroscopy according to the present invention comprises the steps of: (a) applying a pulse train consisting at least of three RF pulses to a nucleus to be observed, then detecting free induction decay signal FIDa emanating from the nucleus during interval $t_2'$ between the second and third pulses of the pulse train, detecting free induction decay signal FIDb emanating from the nucleus during internal $t_2$ subsequent to the third pulse of the pulse train, and storing these two signals in first and second data files, respectively; (b) repeating the step (a) above N times while putting at least one of the three pulses of the pulse train out of phase with the others, storing the free induction decay signals FIDa and FIDb obtained by each measurement in their respective data files; (c) repeating the steps (a) and (b) with different values of the interval $t_1$ between the first and second pulses of the pulse train; (d) forming a linear combination of data items stored in the data files assigned either to the free induction decay signals FIDa or to FIDb; and (e) subjecting the formed data to double Fourier transformation with respect to $t_2$ or $t_2'$ and $t_1$.

In accordance with the present invention, a pulse train, essentially consisting of three pulses as shown in FIG. 2, is employed, and two detection periods $t_2$ and $t_2'$ is set. Free induction decay signals FIDa and FIDb which are obtained during the periods $t_2$ and $t_2'$, respectively, are stored in different data files. Further, one of the three pulses contained in the pulse train is put out of phase with the others. Under this condition, the measurement is repeated. The free induction decay signals FIDa and FIDb obtained by each measurement are stored in their respective data files. After the measurement, a linear combination of data items representing signals FIDa is formed, or a linear combination of data items representing signals FIDb is formed. Then, the resultant data is subjected to double Fourier transformation to derive a two-dimensional spectrum. The manner in which a linear combination of data items is formed is appropriately selected to obtain a desired two-dimensional spectrum. The theory underlying the inventive concept is next described.

In general, sequences of measurements used for homonuclear two-dimensional NMR spectroscopy are classified into five major groups as shown in FIGS. 1(a)–(e). The sequences shown in FIGS. 1(a), (b), and (c) are used to make measurements for yielding COSY, SECSY, and NOESY spectra, respectively. If the second pulse within the sequence shown in FIG. 1(b) is replaced by a 180° pulse, then a two-dimensional J-resolved spectrum will result. The sequence shown in FIG. 1(c) can give a relay correlation spectrum. The sequence shown in FIG. 1(d) is employed to obtain a multiple quantum transition filter COSY spectrum. The sequence shown in FIG. 1(e) is utilized to observe a multiple quantum transition coherence spectrum.

By comparing these measuring sequences shown in FIGS. 1(a)–(e), we can conclude as follows. In the homonuclear two-dimensional NMR spectroscopy, a pulse train consisting of three pulses as shown in FIG. 3 is employed. The interval between the first and second pulses is defined as evolution period $t_1$, the interval between the second and third pulses is defined as detection period $t_2'$, and detection period $t_2$ is set subsequent to the third pulse. Then, all the information giving rise to various two-dimensional NMR spectra is contained in the free induction decay signal FIDa and FIDb which are derived during the two detection periods.

Although all the information is contained, it is not yet sorted. Therefore, the information must be sorted in the manner described below to obtain various two-dimensional NMR spectra. It is now assumed that one free induction decay signal contains two kinds of information A and B in the form of (A+B) in which the two kinds of information are not yet separated. Then, a new free induction decay signal FID II containing two kinds of information A and B in the form of (A−B) is created. The signals FID I and FID II are stored in different data files. After the measurements, linear combinations of both kinds of data are formed. Thus, the two kinds of information A and B can be separately extracted as follows.

$$FID\ I + FID\ II = (A+B) + (A-B) = 2A$$

$$FID\ I - FID\ II = (A+B) - (A-B) = 2B \quad (1)$$

We expand this theory. That is, in general, if N independent data items are contained in each free induction decay signal in unsorted state, and if the obtained free induction decay signals have different combinations of N data items having different signs, then linear combinations of these free induction decay signals are formed as given by formula (1). This makes it possible to separately get the N data items. The signs given to the data items can be changed by varying the phases P1, P2, and P3 of the three RF pulses constituting the pulse train.

Table 1 below shows the phases of the pulses and their corresponding data files under the condition that the phases assume one or more of four values 0°, 90°, 180°, 270°, i.e., the phases are varied in units of 90°.

TABLE 1

| phases of pulses | | | data files for storage | |
|---|---|---|---|---|
| P1 | P2 | P3 | FIDa | FIDB |
| 0° | 0° | 0° | A1 | B1 |
| 0° | 0° | 90° | A1 | B2 |
| 0° | 0° | 180° | A1 | B3 |
| 0° | 0° | 270° | A1 | B4 |
| 0° | 90° | 0° | A2 | B5 |
| 0° | 90° | 90° | A2 | B6 |
| 0° | 90° | 180° | A2 | B7 |
| — | — | — | — | — |
| — | — | — | — | — |

TABLE 1-continued

| phases of pulses | | | data files for storage | |
|---|---|---|---|---|
| P1 | P2 | P3 | FIDa | FIDB |
| 270° | 270° | 270° | A16 | B64 |

It is now assumed that the phases P1, P2, P3 of the pulses can take up four values; 0° (x), 90° (y), 180° (−x), and 270° (−y). Then, the possible combinations of the phases reach 64 in number (4×4×4). In order to store the free induction decay signal FIDb, 64 data files B1–B64 are needed. Since the signal FIDa is determined by the combination of P1 and P2, the number of the necessary data files is 16 (4×4), or A1–A16. Accordingly, in essence, 80 independent data files are needed to be prepared for storage of both signals FIDa and FIDb.

It is to be noted that all of 16 free induction decay signals FIDa and 64 free induction decay signals FIDb do not contain independent and useful information. In cases where only meaningful information about two-dimensional NMR should be collected, only 16, 8, 4, or even 2 decay signals FIDA can be selected. Also, only 32, 16, 8, or about 4 signals FIDb can be selected. The phase shifts illustrated in Table 1 are varied by 90 and 180 degrees, However, useful embodiments can be implemented wherein the phase shifts vary by 15, 30, and 45 degrees.

PREFERRED EMBODIMENT OF THE INVENTION

We now describe one example of the invention in which the phases P2 and P3 of the second and third pulses are changed to 0° and 180° while maintaining the phase P1 of the first pulse at 0°, and in which only two of the signals FIDa and four of the signals FIDb are used.

Figure 4:
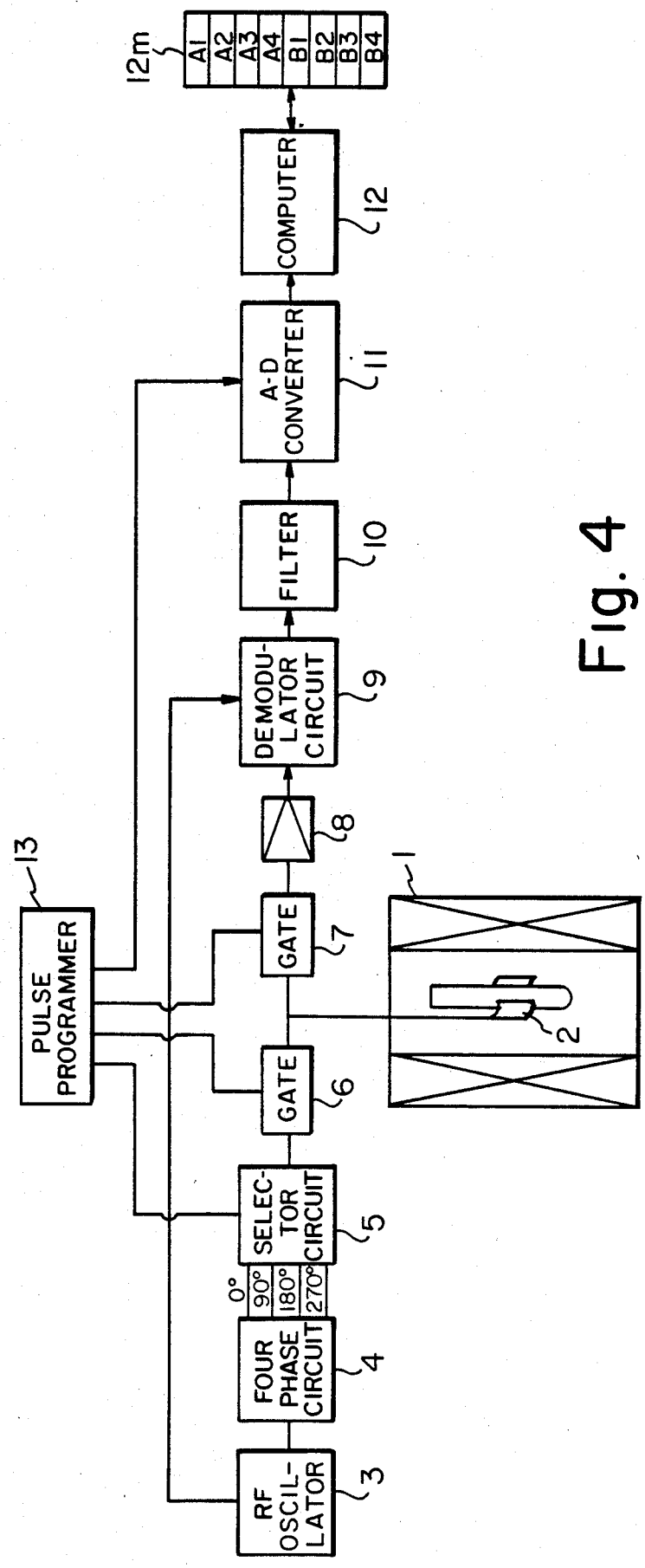
FIG. 4 is a block diagram of an NMR spectrometer for carrying out the method of the invention.

FIG. 4 is a block diagram of an NMR spectrometer for carrying out the two-dimentional NMR spectroscopy according to the invention. The spectrometer has a magnet 1 for producing a static magnetic field, in which a transmitter/receiver coil 2 is disposed. An RF oscillator 3 produces RF waves including the gyromagnetic resonance frequency of the nucleus to be observed. The RF waves are supplied as RF waves or pulse train to the coil 2 via a four-phase circuit 4, a selector circuit 5, and a gate 6, so that the pulses or pulse train is applied to a sample. The period during which the gate 6 is enabled is so adjusted that the duration of the pulses are set to appropriate values. Thus, the magnetization of the nucleus to be observed is rotated through 90° by a 90° pulse. Such operations are performed at appropriate intervals to form a pulse train.

The four-phase circuit 4 and the selector circuit 5 are used to set the RF waves in said 90° pulses to some of 0°, 90°, 180°, and 270°. Let us assume that when the phase is set to 0°, 90°, 180°, and 270°, $90°_x$ pulse, $90°_y$ pulse, $90°_{-x}$ pulse, and $90°_{-y}$ pulse are respectively produced.

As the pulse train is applied to the coil 2, a free induction decay signal is induced in it. This signal is fed via a gate 7 and an amplifier 8 to a democulator circuit 9, wherein it is demodulated. Then, the resultant signal is supplied via a filter 10 and an analog-to-digital converter 11 to a computer 12, so that the signal is stored in data files A1-A4 and B1-B4 in a memory 12m incorporated in the computer. The selector circuit 5, the gates 6, 7, and the A/D converter 11 are controlled by a pulse programmer 13.

In the structure described above, an operator previously sets data about four kinds of pulse trains, the initial value of evolution period $t_1$, the number of values that the phases of the three pulses assume, and the increment, i.e., the difference between one value and the next value that the phases assume. The combination of the phases of three pulses is varied as shown in Table 2 below.

TABLE 2

| No. | pulse phase | | |
|---|---|---|---|
| | P1 | P2 | P3 |
| 1 | 0° | 0° | 0° |
| 2 | 0° | 0° | 180° |
| 3 | 0° | 180° | 0° |
| 4 | 0° | 180° | 180° |

Then, the evolution period is set to initial value $t_{1,001}$. Under this condition, the four pulse trains shown in Table 2 are successively applied to the sample to make four measurements. The resultant signals FIDa and FIDb are stored in their respective data files in the manner shown in Table 3.

TABLE 3

| measurement | pulse phase | | | files for storage | |
|---|---|---|---|---|---|
| No. | P1 | P2 | P3 | FIDa | FIDb |
| 1 | 0° | 0° | 0° | A1 | B1 |
| 2 | 0° | 0° | 180° | A2 | B2 |
| 3 | 0° | 180° | 0° | A3 | B3 |
| 4 | 0° | 180° | 180° | A4 | B4 |

Such a measurement is repeated with 256 different values of $t_1$, such as $t_{1,001}$, $t_{1,002}$, $t_{1,003}$, ..., $t_{1,256}$. The obtained signals FIDa and FIDb are stored in data files A1-A4 and B1-B4 in the manner shown in FIG. 3. Upon completion of the 256 measurements, 256 signals FIDa are stored in the data files A1-A4, corresponding to the 256 vaues of $t_1$. Similarly, 256 signals FIDb are stored in the data files B1-B4.

Tables 4 and 5 show what kinds of two-dimensional NMR information are contained in the signals FIDa and FIDb and how the sign that each piece of information bears is varied according to changes in the combination of the pulse phases.

TABLE 4

| No. | pulse phase | | | kind of information contained in FIDa and sign | |
|---|---|---|---|---|---|
| | P1 | P2 | P3 | axial | SQT (COSY) |
| 1 | 0° | 0° | 0° | + | + |
| 2 | 0° | 0° | 180° | + | + |
| 3 | 0° | 180° | 0° | − | + |
| 4 | 0° | 180° | 180° | − | + |

TABLE 5

| No. | kind of information contained in FIDb and sign | | | | | |
|---|---|---|---|---|---|---|
| | axial | ZQT (COSY) | SQT (COSY) | DQT (COSY) | relay | NOE |
| 1 | + | + | + | + | + | + |
| 2 | − | − | + | − | + | − |
| 3 | + | − | + | − | + | − |
| 4 | − | + | + | + | + | + |

The two-dimensional NMR information appearing on Tables 4 and 5 is briefly described below.

axial ($t_2'$): The magnetization oriented in the direction of Z axis is detected during $t_2'$ after it relaxes during $t_1$.

axial ($t_2$): The magnetization oriented in the direction of Z axis is detected during $t_2$ after it relaxes during $t_2'$.

SQT ($t_2'$): SQT (single quantum transition) occurred during $t_1$, is detected during $t_2'$, producing SQTCOSY spectrum.

SQT ($t_2$): SQT (single quantum transition) occurred during $t_2'$, is detected during $t_2$, producing SQTCOSY spectrum.

ZQT: ZQT (zero quantum transition) evolved during $t_2'$ is detected during $t_2$, producing ZQTCOSY spectrum.

DQT: DQT (double quantum transition) evolved during $t_2'$ is detected during $t_2$, producing DQTCOSY spectrum.

relay: DQT (double quantum transition) resulted in movement of the magnetization during $t_2'$, is detected during $t_2$, producing relay COSY spectrum.

NOE: The magnetization oriented in the direction of Z axis during $t_2'$ is detected during $t_2$ after modulated by the nuclear Overhauser effect or cross relaxation. This procudes NOESY spectrum.

It can be seen from Tables 4 and 5, when the phases of the three pulses are all 0°, i.e., No. 1 in Tables 4 and 5, the symbols given to all information are all +. At No. 2 where the phase of the third pulse is set to 180°, the symbols given to the information axial ($t_2$), ZQT (COSY), DQT (COSY), and NOE are all reversed. Considering the reversion of the symbols, linear combinations of the data files will permit only certain information to be extracted.

As an example, with respect to the data files A1–A4 storing signals FIDa, if linear combinations of the data files are formed as in Table 6 by addition and subtraction, then the resultant one piece of data contains only information about an axial spectrum, the resultant other piece of data containing only information about an SQT (COSY) spectrum.

TABLE 6

| axial | A1 + A2 − A3 − A4 |
|---|---|
| SQT (COSY) | A1 +/A2 + A3 + A4 |

In this way, each linear combination of data items contains separate information. Then, the data is first subjected to Fourier transformation with respect to $t_2'$, for example. Then, the data is subjected to Fourier transformation with respect to $t_1$. This double Fourier transformation gives rise to two-dimensional NMR axial and SQTCOSY spectra.

The data stored in A1 is equivalent to the data stored in A2, because the phases of the first and second pulses are the same. Similarly, the data stored in A3 is equivalent to the data stored in A4. Accordingly, only one of the two equivalent pieces of data may be used. However, if equivalent pieces of data are accumulated as shown in Table 6, then the signal-to-noise ratio will be enhanced. If equivalent pieces of data are all stored in one data file so as to be accumulated, the number of data files can be reduced by two, thus saving the number of the files.

Similar concept applies to data files B1–B4 in which the signals FIDb are stored. Specifically, linear combinations of data files are formed by addition and subtraction as shown in Table 7, by taking into account the symbols given to each piece of information in the same way as in the case of the signals FIDa. Then, the data is subjected to double Fourier transformation with respect to $t_1$ and $t_2$.

TABLE 7

| axial | B1 − B2 + B3 − B4 |
|---|---|
| SQTCOSY relay COSY | B1 + B2 + B3 + B4 |
| ZQTCOSY DQTCOSY NOESY | B1 − B2 − B3 + B4 |

In the above example, at least six data files are necessitated, two for the signals FIDa and four for the signals FIDb. In the information obtained is previously limited to a less number of kinds, a plurality of two-dimensional NMR spectra can be derived using a less number of data files as described below.

Figure 5:
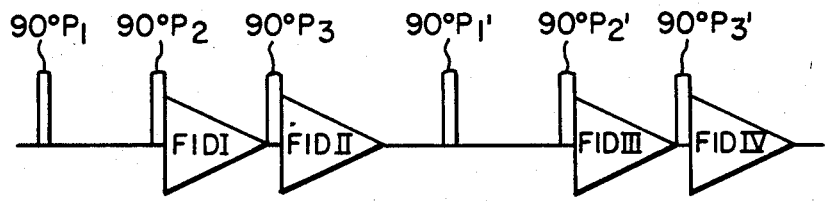
FIG. 5 is a diagram illustrating a measuring sequence according to the invention, the sequence being taken for measurements using four data files.

FIG. 5 shows a sequence in which one measurement was made to obtain COSY, NOESY, and relay COSY spectra at once using four data files. During this measurement, two pulse trains each consisting of three pulses are combined together to derive four free induction decay signals at once. The resultant four signals are successively stored in four data files I, II, III, IV, respectively. As shown in Table 8, four combinations of the phases P1, P2, P3, P1', P2', P3' of the pulses are formed.

TABLE 8

| No. | P1 | P2 | P3 | P1' | P2' | P3' |
|---|---|---|---|---|---|---|
| 1 | 0° | 0° | 0° | 0° | 0° | 180° |
| 2 | 0° | 90° | 90° | 0° | 90° | 270° |
| 3 | 0° | 180° | 180° | 0° | 180° | 0° |
| 4 | 0° | 270° | 270° | 0° | 270° | 90° |

Measurements Nos. 2 and 4 shown in Table 8 were added to determine whether the frequencies obtained by subjecting data to Fourier transformation with respect to $t_1$ are positive or negative. The data obtained by the measurements Nos. 2 and 4 are useful for distinguishing polarity and are substantially equivalent to the data derived by the measurements Nos. 1 and 3 and so the measurements Nos. 2 and 4 can be disregarded for the purposes of the discussion below. Comparison of Nos. 1 and 3 in Table 8 with Table 3 shows that measurement No. 1 in Table 8 is one in which Nos. 1 and 2 in Table 3 are combined together, and that measurement No. 3 in Table 8 is one in which Nos. 4 and 3 in Table 3 are combined together. Since the four free induction decay signals obtained by measurement No. 1 in Table 8 and the four induction decay signals obtained by measurement No. 3 are summed up, the data stored in the data files I–IV in this sequence has the relation shown in Table 9 with the data stored in the data files A1–A4 and B1–B4 in the previous example.

TABLE 9

| I | A1 + A4 |
|---|---|
| II | B1 + B4 |
| III | A2 + A3 |
| IV | B2 + B3 |

Thus, summing up the data files I and III gives $$I+III=A1+A2+A3+A4$$

As can be seen from Table 6, it is possible to derive an SQTCOSY spectrum. Adding up the data stored in the data files II and IV yields $$II+IV=B1+B2+B3+B4$$

Making the difference between the data stored in the data file II and the data stored in the data file IV yields $$II-IV=B1-B2-B3+B4$$

As a result, as can be understood from Table 7, these two arithmetic operations give rise to relay COSY and NOESY spectra, respectively.

Figure 7:
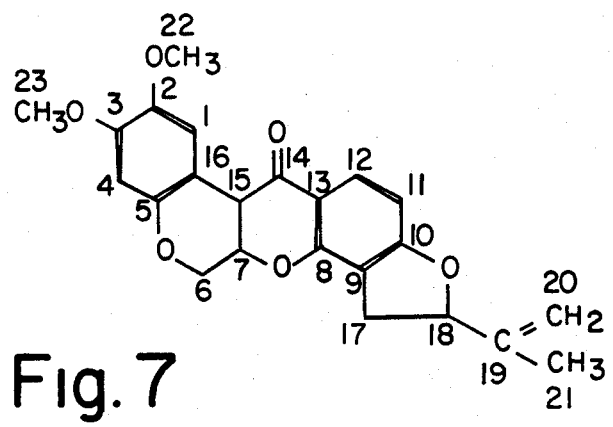
FIG. 7 shows the structural formula of rotenone.
Figure 6A:
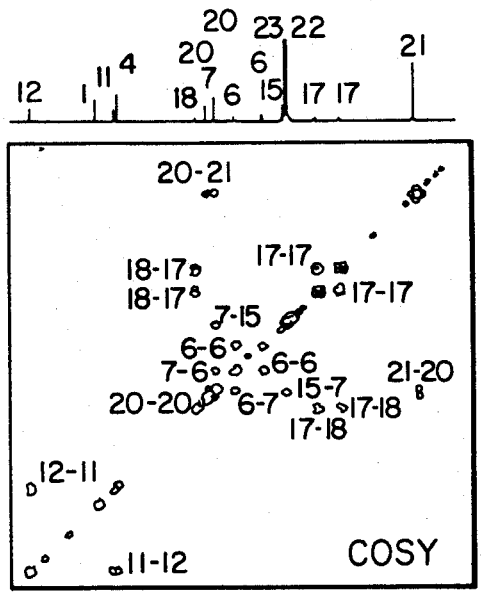
FIGS. 6(a), 6(b), and 6(c) show three two-dimensional NMR spectra obtained using the measuring sequence shown in FIG. 5.
Figure 6B:
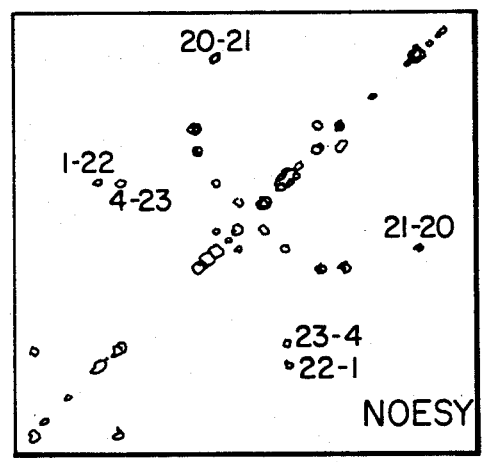
Figure 6C:
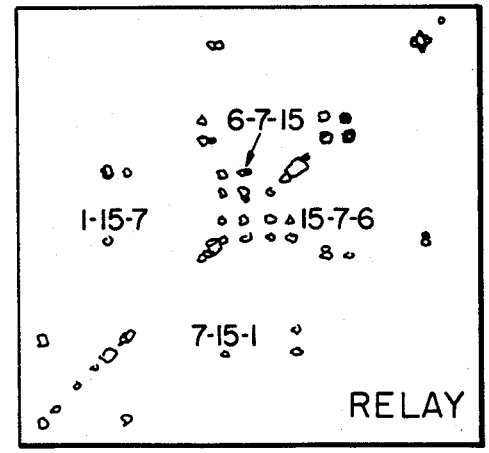
Figure 8:
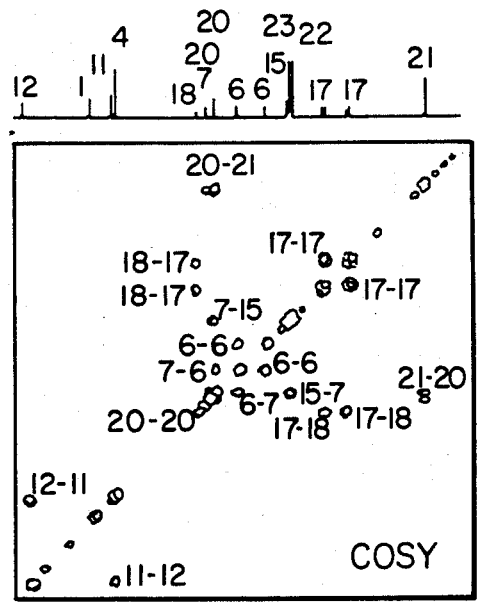
FIGS. 8(a), 8(b) and 8(c) show two-dimensional NMR spectra obtained separately, the three conventional two-dimensional methods.
Figure 8:
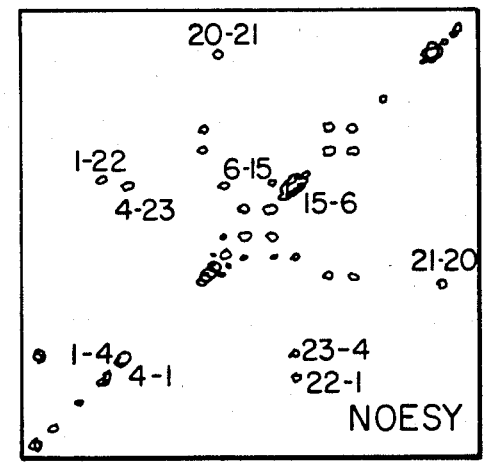
Figure 8:
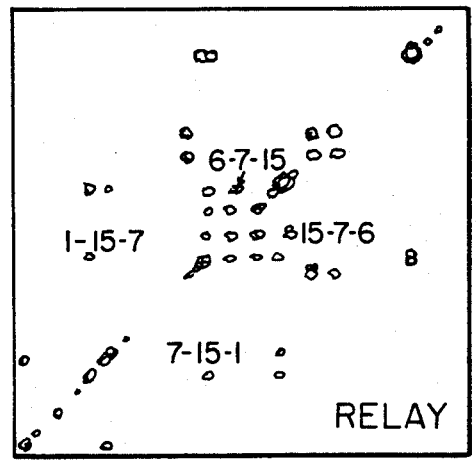

FIGS. 6(a)–(c) show two-dimensional NMR COSY, NOESY, and relay COSY spectra, respectively, which were derived from rotenone ($C_{23}H_{22}O_6$) the structural formula of which is shown in FIG. 7, by a single measurement using the sequence shown in FIG. 5 in accordance with the invention. FIGS. 8(a)–(c) show two-dimensional NMR COSY, NOESY, and relay COSY spectra, respectively, which were separately obtained by performing measurements in accordance with the conventional procedures. The conventional method took a time as about three times longer than the novel method.

In the description above, the manner in which all of the eight listed kinds of information are separated is not set forth. It is possible to separately extract multiple quantum transition correlation spectra, such as ZQTCOSY spectra and DQTCOSY spectra, by introducing phase changes other than 180°, such as 90°, 60°, 45°, 30°, 15°, in MQT filter correlation spectroscopy. Of course, as phase changes are reduced, the number of data files needed is increased.

The invention essentially resides in making use of a pulse train made up of three pulses as mentioned above. It is also possible, however, to use a pulse train consisting of a larger number of pulses adapted for a certain application as shown in FIG. 9.

Figure 1A:
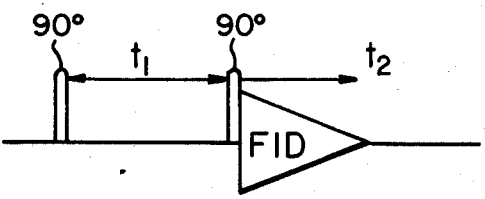
FIG. 1(a) is a diagram illustrating a conventional pulse sequence for yielding COSY spectra.
Figure 1B:
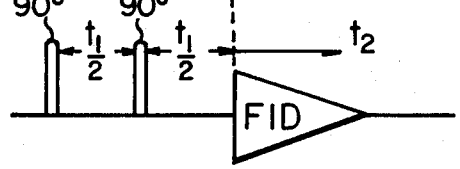
FIG. 1(b) is a diagram illustrating a conventional pulse sequence for yielding SECSY spectra.
Figure 1C:
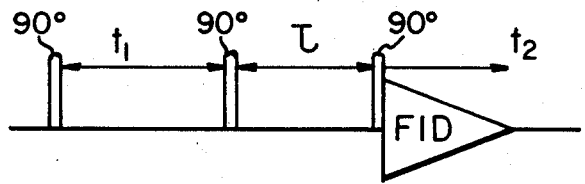
FIG. 1(c) is a diagram illustrating a conventional pulse sequence for yielding NOESY spectra.
Figure 1D:
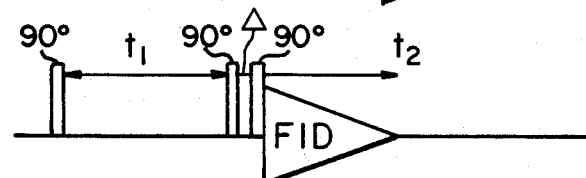
FIG. 1(d) is a diagram illustrating a conventional pulse sequence for yielding multiple quantum transition filter COSY spectra.
Figure 1E:
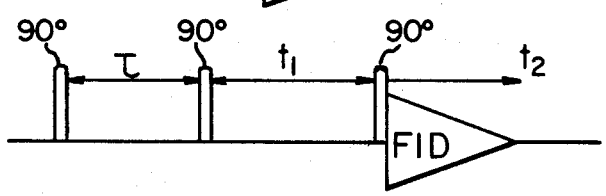
FIG. 1(e) is a diagram illustrating a conventional pulse sequence for yielding multiple quantum transition coherence spectra.
Figure 2:
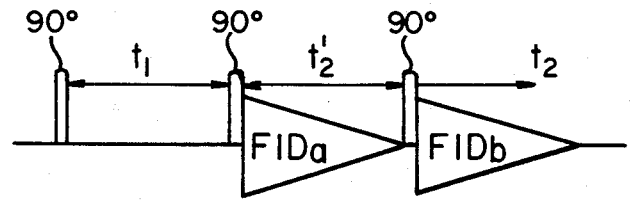
FIG. 2 is a diagram illustrating the measuring sequence used by Haasnoot et al.
Figure 3:
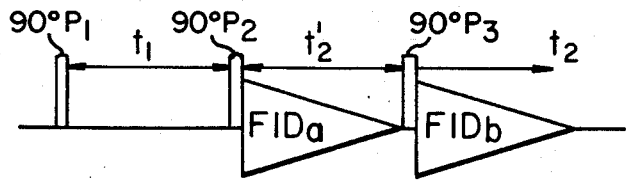
FIG. 3 is a diagram illustrating a fundamental measuring sequence according to the invention.
Figure 9A:
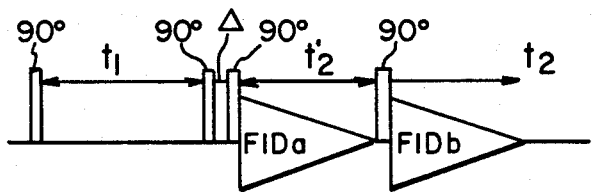
FIG. 9(a) is a diagram illustrating a pulse sequence according to this invention similar to FIG. 3 except that the first and second pulses are replaced by the pulse train for the MQT filter shown in FIG. 1(d)
Figure 9B:
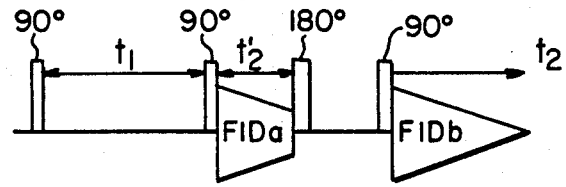
FIG. 9(b) is a diagram illustrating a pulse sequence according to this invention that is obtained by inserting a 180 degree pulse for spin echo during the interval $t_2$, between the second and third pulses in FIG. 3.

FIG. 9(a) shows a pulse train that is created by replacing the first and second pulses shown in FIG. 3 with the pulse train for MQT filter shown in FIG. 1(d). FIG. 9(b) shows a pulse train that is obtained by inserting a 180° pulse for spin echo during the interval $t_2'$ between the second and third pulses shown in FIG. 3. This can improve the signal-to-noise ratio for each free induction decay signal.

As described thus far, in accordance with the invention, a pulse train essentially consisting of three pulses is used to obtain a plurality of kinds of two-dimensional NMR information at once. Linear combinations of them can give separate two-dimensional NMR spectra. However, every kind of two-dimensional NMR information cannot be obtained with good sensitivity by one measurement. As an example, if the sample is a low-molecular substance, the optimum value of the interval $t_2'$ between the second and third pulses differs widely between NOESY and relay COSY spectra.

In such a case, a measurement is contemplated in which a waiting period $\tau$ is established subsequent to the detection period $t_2'$ shown in FIGS. 1(a)–(c), the period $\tau$ being changed from $\tau_1$ to $\tau_n$ so as to assume n different values. This method requires that the number of the necessary data files is increased by a factor of n, but it yields the following excellent advantages: (1) it is possible to examine the dependence of the NOE peak in any NOESY spectrum upon the period $(t_2'+\tau)$; (2) it is possible to make measurements with good sensitivity and the optimum waiting time for obtaining a COSY or relay COSY spectrum; (3) it is possible to stress peaks of different coupling constants (J). For example, it is advantageous to make the waiting time longer to produce a COSY spectrum having a long-range coupling.

What is claimed is:

1. A two-dimensional nuclear magnetic resonance spectroscopy method comprising the steps for:
   (a) applying a pulse train consisting of at least three RF pulses having the same phase to a nucleus to be observed, the pulses containing the resonance frequency of the nucleus, then detecting free induction decay signal FIDa emanating from the nucleus during interval $t_2'$ between the second and third pulses of the pulse train, detecting free induction decay signal FIDb emanating from the nucleus during interval $t_2$ subsequent to the third pulse of the pulse train, and storing these two signals in first and second data files, respectively;
   (b) repeating the step (a) above N times while putting at least one of the three pulses of the pulse train out of phase with the others, storing the free induction decay signals FIDa and FIDb obtained by each measurement in their respective data files;
   (c) repeating the steps (a) and (b) with different values of the interval $t_1$ between the first and second pulses of the pulse train;
   (d) forming a linear combination of data items stored in the data files assigned either to the free induction decay signals FIDa or to FIDb; and
   (e) subjecting the formed data to double Fourier transformation with respect to $t_2$ or $t_2'$ and $t_1$.

2. A two-dimensional nuclear magnetic resonance spectroscopy method as set forth in claim 1, wherein each time the step (b) is carried out, the phases of the pulses are varied by 15°, 30°, 45°, 90°, or 180°.

3. A two-dimensional nuclear magnetic resonance spectroscopy method comprising the steps of:
   (a) applying a pulse train consisting of at least three RF pulses having the same phase to a nucleus to be observed, the pulses containing the resonance frequency of the nucleus then detecting free induction decay signal FIDa emanating from the nucleus during interval $t_2'$ between the second and third pulses of the pulse train, detecting free induction decay signal FIDb emanating from the nucleus during interval $t_2$ subsequent to the third pulse train, and storing these two signals in first and second data files, respectively;
   (b) repeating the step (a) above N times while putting at least one of the three pulses of the pulse train out of phase with the others, storing the free induction decay signals FIDa and FIDb obtained by each measurement in their respective ones of 2N data files;
   (c) repeating the steps (a) and (b) with different values of the interval $t_1$ between the first and second pulses of the pulse train;
   (d) repeating the steps (a)–(c) with different values of the interval $t_2'$ between the second and third pulses of the pulse train;
   (e) forming a linear combination of data items stored in the data files assigned either to the free induction decay signals FIDa or to FIDb; and
   (f) subjecting the formed data to double Fourier transformation with respect to $t_2$ or $t_2'$ and $t_1$.

4. A two-dimensional nuclear magnetic resonance spectroscopy as set forth in claim 3, wherein each time the step (b) is carried out, the phases of the pulses are varied by 15°, 30°, 45°, 90°, or 180°.

* * * * *